United States Patent
Nishiyama et al.

(10) Patent No.: US 7,839,224 B2
(45) Date of Patent: Nov. 23, 2010

(54) OSCILLATOR WITH A STABLE OSCILLATING FREQUENCY

(75) Inventors: Hideki Nishiyama, Kyoto (JP); Takeshi Kuga, Kyoto (JP); Yoshiro Fujii, Kyoto (JP); Akihiro Okui, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 92 days.

(21) Appl. No.: 12/239,071

(22) Filed: Sep. 26, 2008

(65) Prior Publication Data

US 2009/0085676 A1    Apr. 2, 2009

(30) Foreign Application Priority Data

Sep. 28, 2007  (JP) .............................. 2007-255434
Aug. 6, 2008   (JP) .............................. 2008-202973

(51) Int. Cl.
*H03K 3/03*   (2006.01)

(52) U.S. Cl. ........................................ 331/57; 331/185

(58) Field of Classification Search ................ 331/45, 331/57, 185

See application file for complete search history.

(56) References Cited

U.S. PATENT DOCUMENTS 6,985,040 B2 *  1/2006  Kim ............................. 331/16
2008/0136539 A1 *  6/2008  Oka et al. ..................... 331/57

FOREIGN PATENT DOCUMENTS

JP      2002-093162        3/2002

\* cited by examiner

*Primary Examiner*—Robert Pascal
*Assistant Examiner*—Levi Gannon
(74) *Attorney, Agent, or Firm*—Fish & Richardson P.C.

(57) ABSTRACT

An oscillator of the present invention includes a constant current circuit in which a constant current generated in the constant current circuit varies positively with an on threshold voltage of a transistor included in the constant circuit; and an oscillating circuit in which the oscillating frequency of a clock signal generated in the oscillating circuit varies positively with the constant current supplied from the constant current circuit, and the oscillating frequency of the clock signal generated in the oscillating circuit varies negatively with an on threshold voltage of a transistor included in the oscillating circuit.

3 Claims, 27 Drawing Sheets

FIG. 2

| TERMINAL NUMBER | TERMINAL NAME | INPUT/ OUTPUT | FUNCTION |
|---|---|---|---|
| 1 | A0 | INPUT | SLAVE ADDRESS SET TERMINAL |
| 2 | A1 | INPUT | 〃 |
| 3 | A2 | INPUT | 〃 |
| 4 | GND | — | GROUND VOLTAGE TERMINAL(0[V]) |
| 5 | SDA | INPUT/ OUTPUT | SLAVE ADDRESS INPUT TERMINAL<br>WORD ADDRESS INPUT TERMINAL<br>SERIAL DATA INPUT TERMINAL<br>SERIAL DATA OUTPUT TERMINAL |
| 6 | SCL | INPUT | SERIAL CLOCK INPUT TERMINAL |
| 7 | WP | INPUT | WRITE-PROTECT TERMINAL |
| 8 | Vcc | — | POWER SUPPLY VOLTAGE TERMINAL |

FIG. 3

| ITEM | SYMBOL | SPECIFIED VALUE | UNIT | CONDITIONS |
|---|---|---|---|---|
| "H" INPUT VOLTAGE 1 | $V_{IH1}$ | 0.7VCC~VCC+1.0 | V | |
| "L" INPUT VOLTAGE 1 | $V_{IL1}$ | −0.3~0.3VCC | V | |
| "L" OUTPUT VOLTAGE 1 | $V_{OL1}$ | 0.4 | V | $I_{OL}$=3.0mA, 2.5V≦VCC≦5.5V(SDA) |
| "L" OUTPUT VOLTAGE 2 | $V_{OL2}$ | 0.2 | V | $I_{OL}$=0.7mA, 1.7V≦VCC<2.5V(SDA) |
| INPUT LEAKAGE CURRENT | $I_{LI}$ | −1~1 | μA | $V_{IN}$=0V~VCC |
| OUTPUT LEAKAGE CURRENT | $I_{LO}$ | −1~1 | μA | $V_{OUT}$=0V~VCC(SDA) |
| CONSUMPTION CURRENT DURING OPERATION | $I_{CC1}$ | 2.0 | mA | VCC=5.5V,$f_{SCL}$=400kHz, $t_{WR}$=5ms<br>BYTE WRITE<br>PAGE WRITE |
| | $I_{CC2}$ | 0.5 | mA | VCC=5.5V,$f_{SCL}$=400kHz<br>RANDOM READ<br>CURRENT READ<br>SEQUENTIAL READ |
| STANDBY CURRENT | $I_{SB}$ | 2.0 | μA | VCC=5.5V,SDA,SCL=VCC<br>WP=GND  A0,A1,A2=GND |

FIG. 8

| tR | tOFF | Vbot |
|---|---|---|
| 10MS OR LESS | 10MS OR MORE | 0.3V OR LESS |
| 100MS OR LESS | 10MS OR MORE | 0.2V OR LESS |

FIG. 10

| ITEM | SYMBOL | SPECIFIED VALUE | UNIT |
| --- | --- | --- | --- |
| SCL FREQUENCY | fSCL | 400 | kHz |
| DATA CLOCK H PERIOD | tHIGH | 0.6 | $\mu s$ |
| DATA CLOCK L PERIOD | tLOW | 1.2 | $\mu s$ |
| SDA/SCL RISING PERIOD | tR | 0.3 | $\mu s$ |
| SDA/SCL FALLING PERIOD | tF | 0.3 | $\mu s$ |
| START CONDITION HOLD PERIOD | tHD:STA | 0.6 | $\mu s$ |
| START CONDITION SET UP PERIOD | tSU:STA | 0.6 | $\mu s$ |
| INPUT DATA HOLD PERIOD | tHD:DAT | 0 | ns |
| INPUT DATA SET UP PERIOD | tSU:DAT | 100 | ns |
| OUTPUT DATA DELAY PERIOD | tPD | 0.1~0.9 | $\mu s$ |
| OUTPUT DATA HOLD PERIOD | tDH | 0.1 | $\mu s$ |
| STOP CONDITION SET UP PERIOD | tSU:STO | 0.6 | $\mu s$ |
| BUS OPEN PERIOD BEFORE TRANSFER | tBUF | 1.2 | $\mu s$ |
| INTERNAL WRITE CYCLE PERIOD | tWR | 5 | ms |
| NOISE ELIMINATION EFFECTIVE PERIOD (SCL/SDA TERMINAL) | tI | 0.1 | $\mu s$ |
| WP HOLD PERIOD | tHD:WP | 0 | ns |
| WP SET UP PERIOD | tSU:WP | 0.1 | $\mu s$ |
| WP EFFECTIVE PERIOD | tHIGH:WP | 1.0 | $\mu s$ |

FIG. 14

| 10 10 | A2 | A1 | A0 | R/$\overline{W}$ |

OSCILLATOR WITH A STABLE OSCILLATING FREQUENCY

CROSS-REFERENCE TO RELATED APPLICATIONS

This application is based on Japanese Patent Applications No. 2007-255434 filed on Sep. 28, 2007 and No. 2008-202973 filed on Aug. 6, 2008, the contents of which are hereby incorporated by reference.

BACKGROUND OF THE INVENTION

1. Field of the Invention

The present invention relates to an oscillator for generating clock signals (for example, clocks for use in counting a memory write period).

2. Description of Related Art

In recent years, non-volatile semiconductor memories (for example, an EEPROM (electronically erasable and programmable read only memory)) have been widely used for various types of data storage (such as for automatically controlling filter characteristics, amplification and the like, performing localization and storing state information prior to turning off of power) in consumer devices, industrial devices and other devices JP-A-2002-093162 (hereinafter called patent document 1) is an example of conventional technology related to the foregoing.

The write period for a semiconductor memory depends on the oscillating frequency of a clock signal generated by an oscillator. Thus, oscillators used in such an application are required to generate clock signals of stable oscillating frequency over a wide range of power supply voltages.

In the fields of mobile telephones and camera modules, semiconductor memories are required to be driven with a low voltage (a 1.7 volt drive). Oscillators used in such applications are not only required to be driven with a low voltage, but also required to maintain a proper oscillating frequency characteristic while being driven with a low voltage.

In oscillators incorporated in semiconductor memories and even oscillators in other applications, the important problem to be solved is to provide a stable oscillating frequency and a low voltage drive.

SUMMARY OF THE INVENTION

An object of the present invention is to provide an oscillator that can provide a stable oscillating frequency and a low voltage drive.

To achieve the above object, according to one aspect of the present invention, there is provided an oscillator that includes: a constant current circuit in which a constant current generated in the constant current circuit varies positively with an on threshold voltage of a transistor included in the constant circuit; and an oscillating circuit in which an oscillating frequency of a clock signal generated in the oscillating circuit varies positively with the constant current supplied from the constant current circuit, and the oscillating frequency of the clock signal generated in the oscillating circuit varies negatively with an on threshold voltage of a transistor included in the oscillating circuit.

Other features, elements, steps, advantages and characteristics of the present invention will become apparent from the detailed description of preferred embodiments that follows with reference to the accompanying drawings.

BRIEF DESCRIPTION OF THE DRAWINGS

FIG. 2 is a list showing the terminal numbers, the terminal names, the input/output classification and the functions of external terminals;

FIG. 3 is a list showing electrical characteristics of the semiconductor device 10;

FIG. 8 is a list showing recommended conditions for a period tR, a period tOFF and a voltage Vbot;

FIGS. 9A and 9B are timing charts showing examples of methods for controlling a SCL terminal and a SDA terminal when power is turned on;

FIG. 10 is a list showing operation-timing characteristics of the semiconductor device 10;

FIG. 14 is a data map showing the detail of a slave address;

DETAILED DESCRIPTION OF PREFERRED EMBODIMENTS

Figure 1:
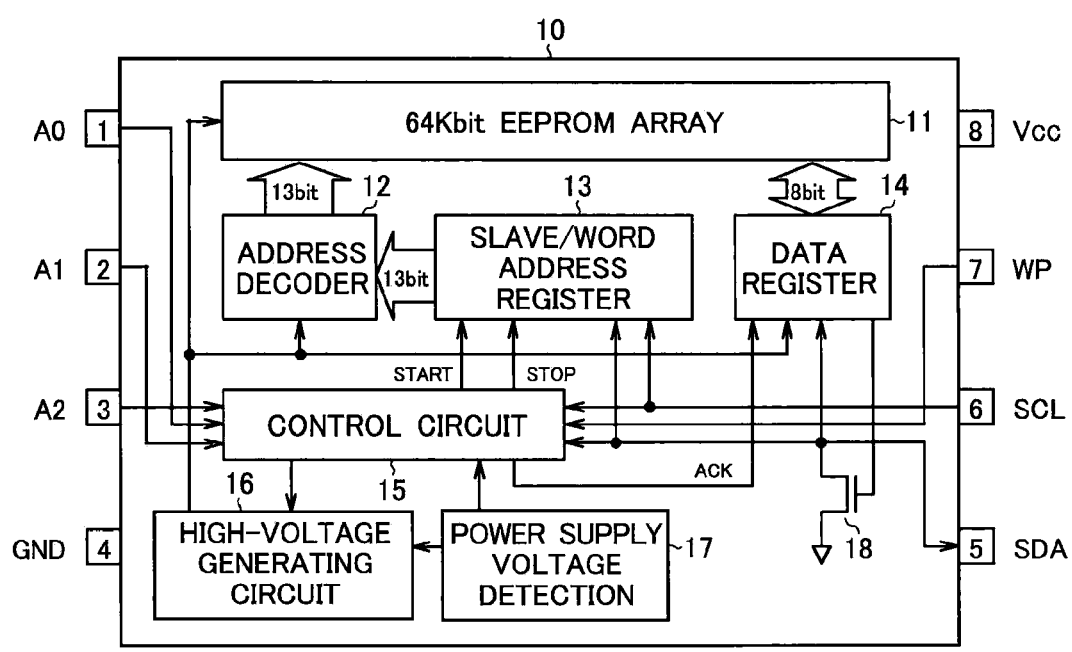
FIG. 1 is a block diagram showing a semiconductor device according to an embodiment of the present invention.

FIG. 1 is a block diagram showing a semiconductor device (a silicon monolithic integrated circuit) according to an embodiment of the present invention.

A general description will first be given of the semiconductor device 10 of this embodiment.

The semiconductor device 10 shown in FIG. 1 and according to this embodiment is a fully I²C bus-compliant general-purpose serial EEPROM. In addition to having a 64K bit capacity (8192 words by 8 bits configuration) shown in the figure, the semiconductor device 10 preferably comes in different capacities such as a 16K bit capacity, a 32K bit capacity, a 128K bit capacity and a 256K bit capacity. In this way, the semiconductor devices 10 of various capacities become available, and this allows users to select an appropriate capacity according to their particular applications.

A description will now be given of the features of the semiconductor device 10 of this embodiment.

The first feature is that the semiconductor device 10 operates over a wide range of power supply voltages (1.7 to 5.5 volts). The second feature is that as described above, the semiconductor device 10 is fully compliant with an I²C bus serving as a two-wire serial interface. The third feature is that the semiconductor device 10 has automatic deletion and completion capability on data rewriting. The fourth feature is that the semiconductor device 10 has page write mode capability (32 bytes). The fifth feature is that the semiconductor device 10 operates with low current consumption (in an operation mode: 1.5 mA (typically), in a standby mode: 0.1 μA (typically)). The sixth feature is that the semiconductor device 10 has erroneous write prevention capability (write protect capability and capability for preventing write operation on a low power supply voltage). The seventh feature is that the semiconductor device 10 has a small package. The eighth feature is that the semiconductor device 10 employs a high-reliability fine-line CMOS process. The ninth feature is that the semiconductor device 10 employs a W-cell structure that was originally developed by the applicant of the present invention and thus it is highly reliable. The tenth feature is that the semiconductor device 10 can rewrite data one million times. The eleventh feature is that the semiconductor device 10 can retain data for forty years. The twelfth feature is that an SLC terminal (a clock terminal) and an SDA terminal (a data terminal) incorporate a noise filter. The thirteenth feature is that data "FF" (hexadecimal) is stored at all addresses before shipment.

As shown in FIG. 1, the semiconductor device 10 of this embodiment having the above-described features is formed by integrating an EEPROM array 11, an address decoder 12, a slave/word address register 13, a data register 14, a control circuit 15, a high-voltage generating circuit 16, a power supply voltage detection circuit 17 and a data output transistor 18.

The 64K bit EEPROM array 11 shown in FIG. 1 is a memory cell array of 8192 words by 8 bits configuration; it includes the following three sections: a main array that stores user data; a check array that stores a CRC (cyclic redundancy check) for each row of the main array; and a buffer array that temporally stores write data. The EEPROM array 11 also includes a driver for applying a high voltage to a memory cell when data is written.

The address decoder 12 decodes a 13-bit parallel signal that is fed in parallel from the slave/word address register 13, and feeds it as a 13-bit address signal (slave address and word address) to the EEPROM array 11.

The slave/word address register 13 temporarily stores an address signal that is serially fed via the SDA terminal (the fifth pin), and feeds it as the 13-bit parallel signal to the address decoder 12. The slave/word address register 13 also serves as a counter to increment an address only with a clock.

The data register 14 temporarily stores a data signal that is serially fed via the SDA terminal (the fifth pin), and feeds it as an eight-bit parallel signal to the EEPROM array 11 (specifically, to the previously mentioned buffer array (page buffer)). The data register 14 incorporates a sense amplifier that checks whether data that is read in parallel from the EEPROM array 11 is one or zero and serially stores it in the register.

The control circuit 15 decodes a command signal fed via the SDA terminal (the fifth pin) to control both the enabling performed in an analog block (including the high-voltage generating circuit 16) and the production of various control signals (a start bit START, a stop bit STOP and an acknowledge signal ACK).

The high-voltage generating circuit 16 steps up voltage to generate a high voltage when data is written; it generally includes a charge pump.

The power supply voltage detection circuit 17 monitors a power supply voltage Vcc that is applied to a Vcc terminal (the eighth pin), and prevents a write operation to the EEPROM array 11 when its voltage level drops below a predetermined lower limit.

The data output transistor 18 is turned on and off according to an instruction of the data register 14 when data is read, and an output signal is derived from its drain to the SDA terminal (the fifth pin). That is, the data output transistor 18 serves as an open-drain data output transistor.

The semiconductor device 10 of this embodiment has eight external terminals (the first to eighth pins) to achieve electrical connection to the outside.

FIG. 2 is a list showing the terminal numbers, the terminal names, the input/output classification and the functions of the external terminals.

An A0 terminal (the first pin), an A1 terminal (the second pin) and an A2 pin (the third pin) are external terminals through which the slave address (000 to 111) of the semiconductor device 10 is set.

A GND terminal (the fourth pin) is an external terminal through which a ground voltage (zero volts) for all input/output signals is applied.

The SDA terminal (the fifth pin) is an external terminal through which serial data signals SDA (a command signal, an address signal and a data signal) are received from a master (such as a microcomputer) and a data signal read from the EEPROM array 11 is fed to the master. In order to serve as an open-drain output terminal with the transistor 18, the SDA terminal has a pull-up resistor (unillustrated) connected externally.

An SCL terminal (the sixth pin) is an external terminal through which a serial clock signal SCL is received from the master.

A WP terminal (the seventh pin) is an external terminal through which a write-protect signal WP is received from the master or the like.

The Vcc terminal (the eighth pin) is an external terminal through which the power supply voltage Vcc is received.

FIG. 3 is a list showing electrical characteristics of the semiconductor device 10 configured as described above. Unless otherwise specified, the list of the electrical characteristics shown in FIG. 3 indicates values observed at an ambient temperature Ta of −40° C. to 85° C. by application of a power supply voltage Vcc of 1.7 to 5.5 volts.

Figure 4:
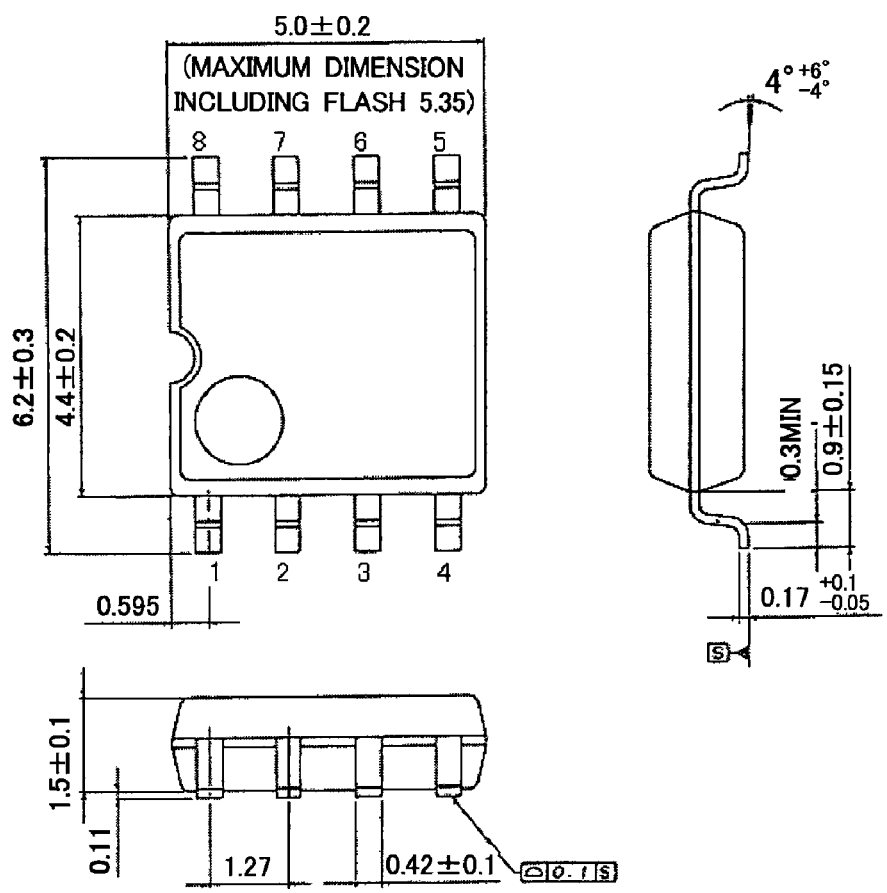
FIG. 4 is a drawing showing an example of the external shape of the package of the semiconductor device 10 and its dimensions.
Figure 5:
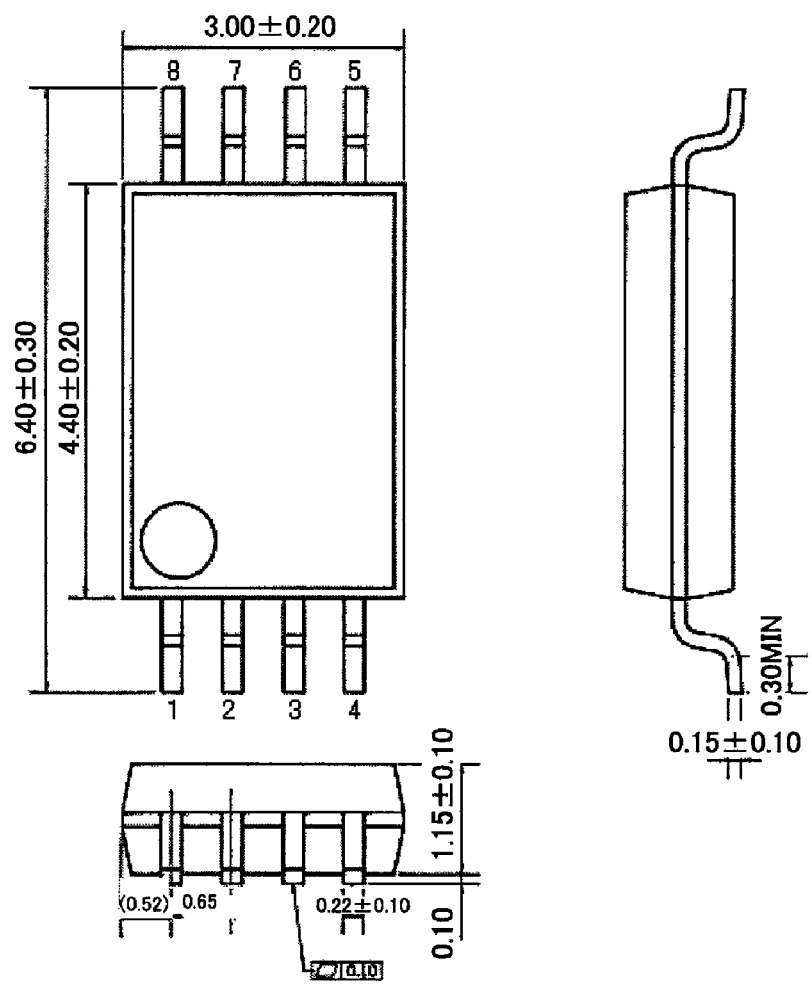
FIG. 5 is a drawing showing another example of the external shape of the package of the semiconductor device 10.
Figure 6:
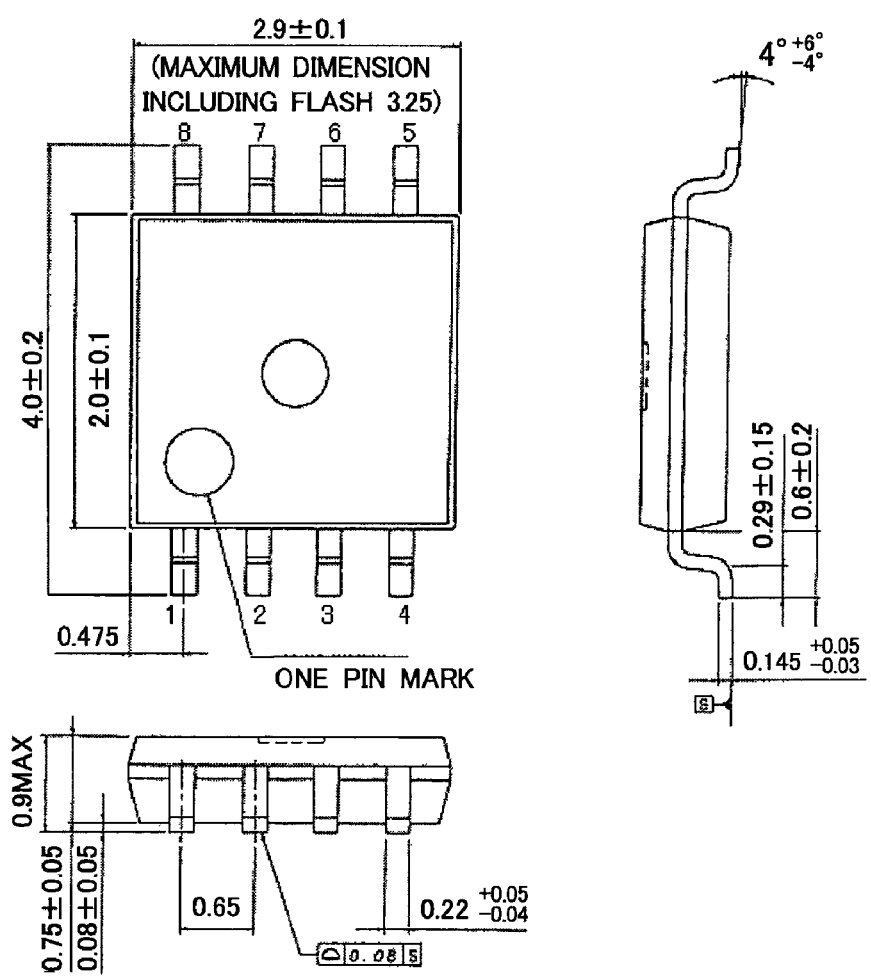
FIG. 6 is a drawing showing another example of the external shape of the package of the semiconductor device 10.

FIGS. 4, 5 and 6 are drawings showing examples of the external shape of the package of the semiconductor device 10 and their dimensions.

A description will now be given of cautions that should be taken when power is turned on.

When the semiconductor device 10 is turned on, the power supply voltage Vcc rises through a low-voltage region where the internal circuit of the semiconductor device 10 or a completed device incorporating the semiconductor device 10 operates unstably. Thus, the internal circuit of the semiconductor device 10 is not completely reset, and this may cause a malfunction. To overcome this problem, the semiconductor device 10 of this embodiment incorporates, as means for preventing such a malfunction when the semiconductor device 10 is turned on, two types of protection circuits (a power-on reset circuit and a circuit for preventing write operation on a low power supply voltage).

In particular, in order to ensure that the protection circuits operate properly, it is preferable that conditions (1) to (3) below be satisfied when power is turned on.

Condition (1) is that when power is turned on, the SDA terminal (the fifth pin) is high and the SCL terminal (the sixth pin) is low or high.

Figure 7:
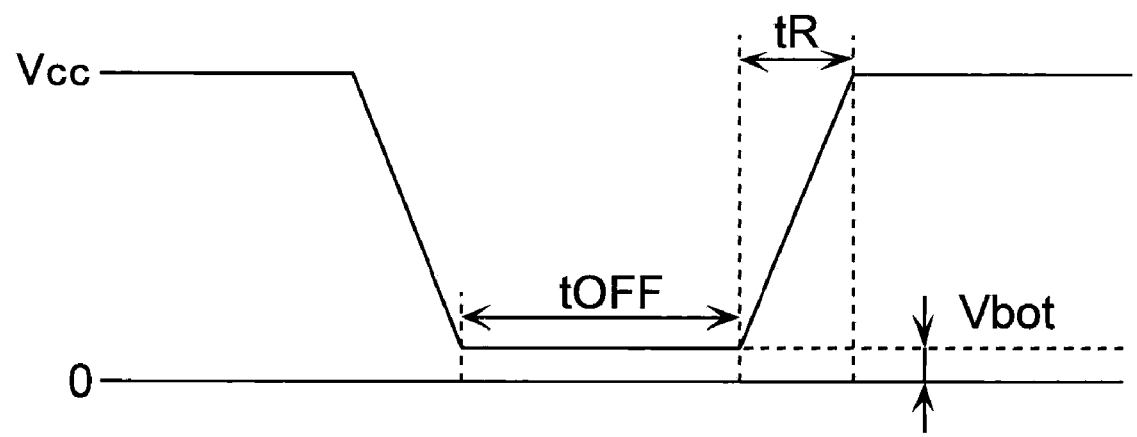
FIG. 7 is a waveform diagram showing the behavior of a power supply voltage Vcc when it rises.

Condition (2) is that with respect to the waveform of a rising power supply voltage Vcc shown in FIG. 7, the power supply voltage Vcc rises such that recommended conditions shown in FIG. 8 for a period tR, a period tOFF and a voltage Vbot are satisfied to allow the power-on reset circuit to operate.

Condition (3) is that the SDA terminal and the SCL terminal do not have a high impedance.

Figure 9A:
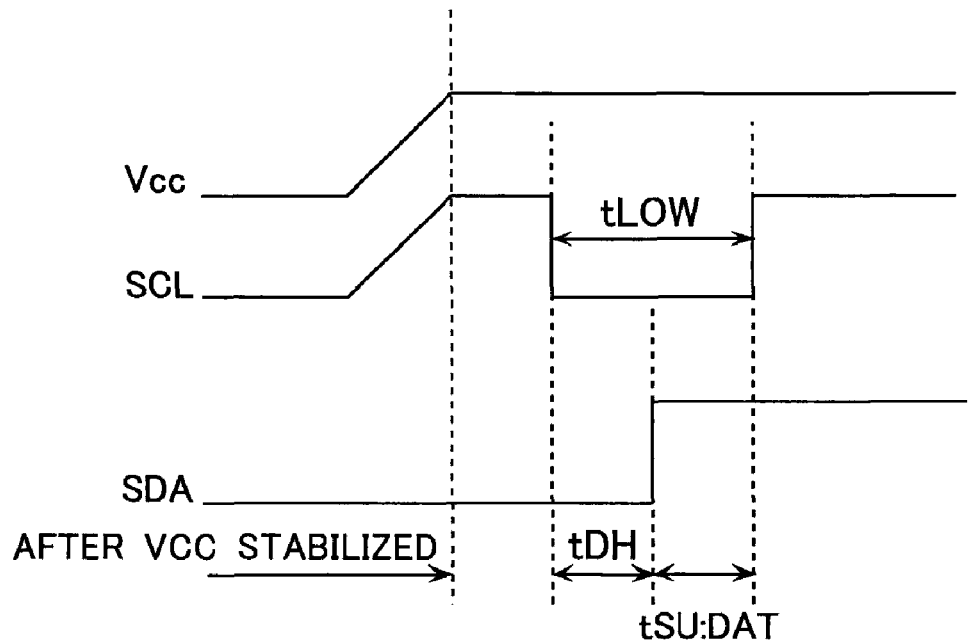
Figure 9B:
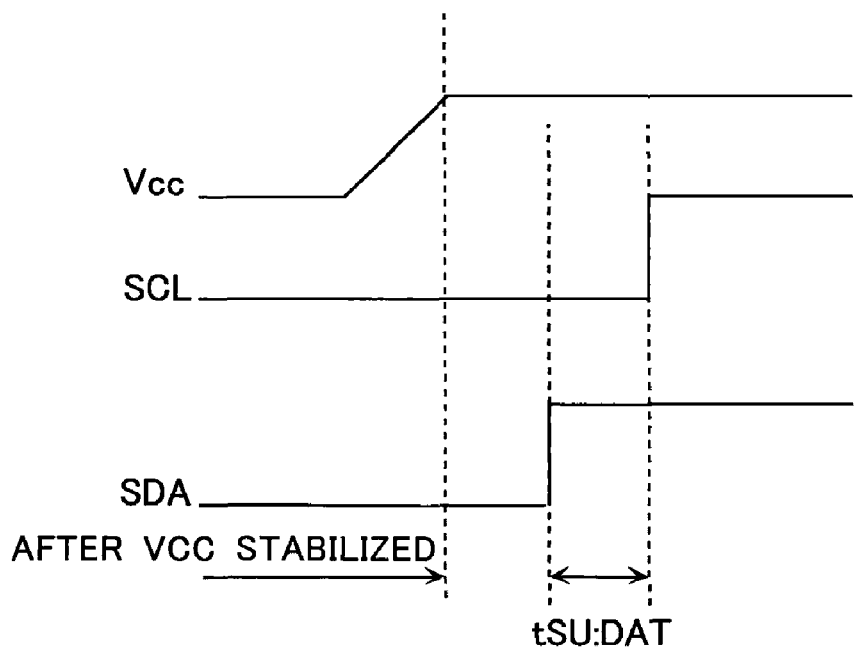

In a case where condition (1) described above is not satisfied and the SDA terminal is low when power is turned on, it is preferable that after the power supply voltage Vcc is stabilized, the SCL terminal and the SDA terminal be turned high as shown in FIGS. 9A and 9B (measure (i)).

In a case where condition (2) described above is not satisfied, it is preferable that after the power supply voltage Vcc is stabilized, software be reset (measure (ii)).

In a case where both conditions (1) and (2) described above are not satisfied, it is necessary to perform measure (ii) after performing measure (i).

A description will now be given of operation-timing characteristics of the semiconductor device 10.

FIG. 10 is a list showing operation-timing characteristics of the semiconductor device 10. Unless otherwise specified, the list of the operation-timing characteristics shown in FIG. 10 indicates values observed at an ambient temperature Ta of −40° C. to 85° C. by application of the power supply voltage Vcc of 1.7 to 5.5 volts.

Figure 11A:
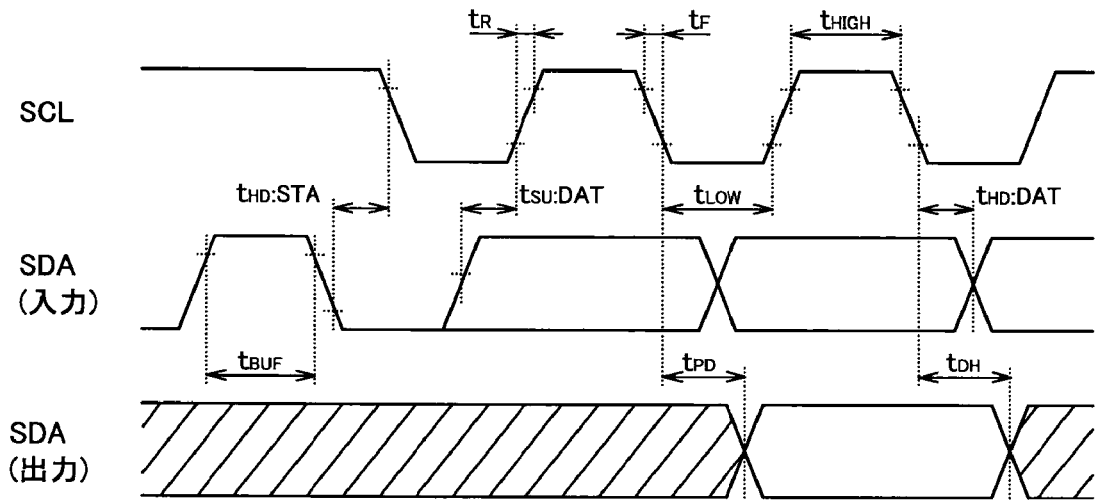
FIGS. 11A and 11B are timing charts showing the timing of the input and output of synchronous data.
Figure 11B:
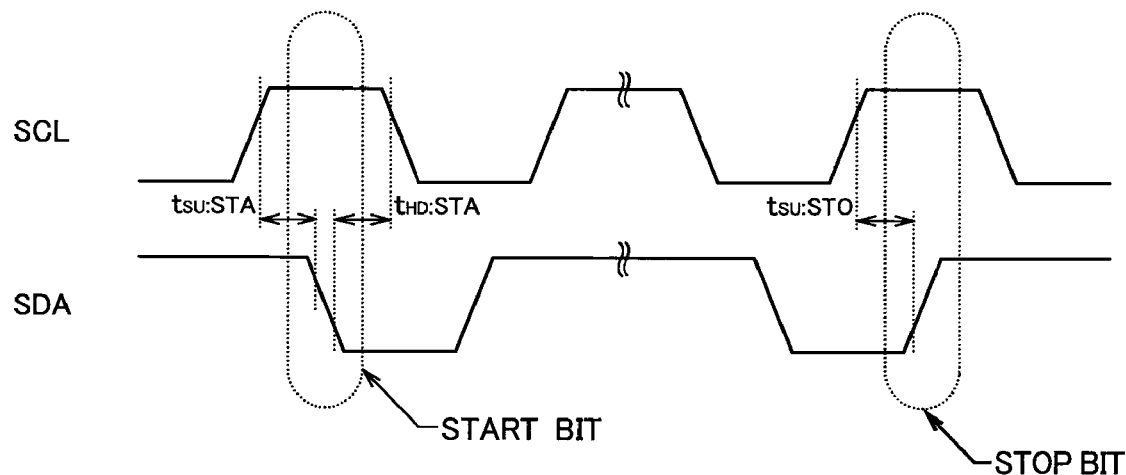

FIGS. 11A and 11B are timing charts showing the timing of the input and output of synchronous data. In particular, in FIG. 11B, the operation-timing characteristics in a start condition and a stop condition are shown.

As shown in FIG. 11A, the semiconductor device 10 is triggered on the rising edge of the serial clock signal SCL to read the serial data signal SDA fed from the master. In contrast, the semiconductor device 10 is triggered on the falling edge of the serial clock signal SCL to feed the serial data signal SDA to the master.

In the semiconductor device 10, as shown in FIG. 11B, before data read operation and data write operation are performed, it is necessary to turn, when the serial clock signal SCL is high, the serial data signal SDA from high to low. The semiconductor device 10 recognizes such a condition as the start condition (start bit) and thereafter executes instructions. Since the semiconductor device 10 detects whether or not the serial data signal SDA and the serial clock signal SCL are in the start condition (the start bit), it executes no instructions as long as the conditions described above are satisfied.

In contrast, in the semiconductor device 10, as shown in FIG. 11B, after the data read operation and the data write operation are completed, it is necessary to turn, when the serial clock signal SCL is high, the serial data signal SDA from low to high. The semiconductor device 10 recognizes such a condition as the stop condition (stop bit) to stop the operation being performed and then enter a standby mode for the next start condition (start bit).

It is preferable to appropriately set various periods (tR, tF, tHIGH, tHD:STA, tSU:DAT, tLOW, tHD:DAT, tBUF, tPD, tDH, tSU:STA, tHD:STA and tSU:STO) shown in FIGS. 11A and 11B according to specifications shown in FIG. 10.

Figure 12:
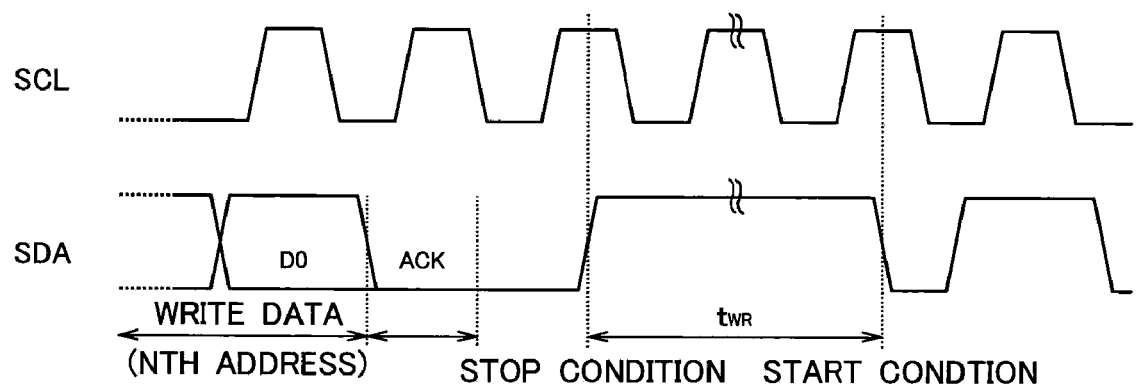
FIG. 12 is a timing chart showing the timing in a write cycle.

FIG. 12 is a timing chart showing the timing in a write cycle.

When written into the EEPROM array 11, an address signal and a data signal are temporarily stored in the slave/word address register 13 and the data register 14, respectively, and thereafter starts to be actually written into the EEPROM array 11 by the input of the stop condition (stop bit). It should be noted that when the semiconductor device 10 is in a write mode, unless the stop bit is inputted, the data transferred to the semiconductor device 10 is not written into the EEPROM array 11.

It is preferable that an internal write cycle period tWR after the input of the stop condition until the input of the next start condition be set at 5 ms or more in consideration of a period required to write data into the EEPROM array 11.

Figure 13A:
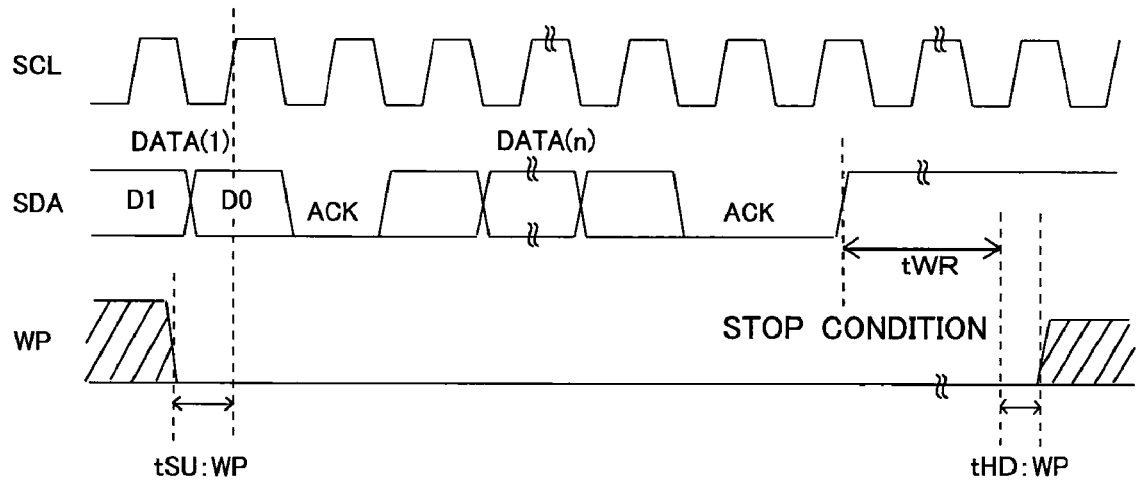
FIGS. 13A and 13B are timing charts showing the timing of write protection.
Figure 13B:
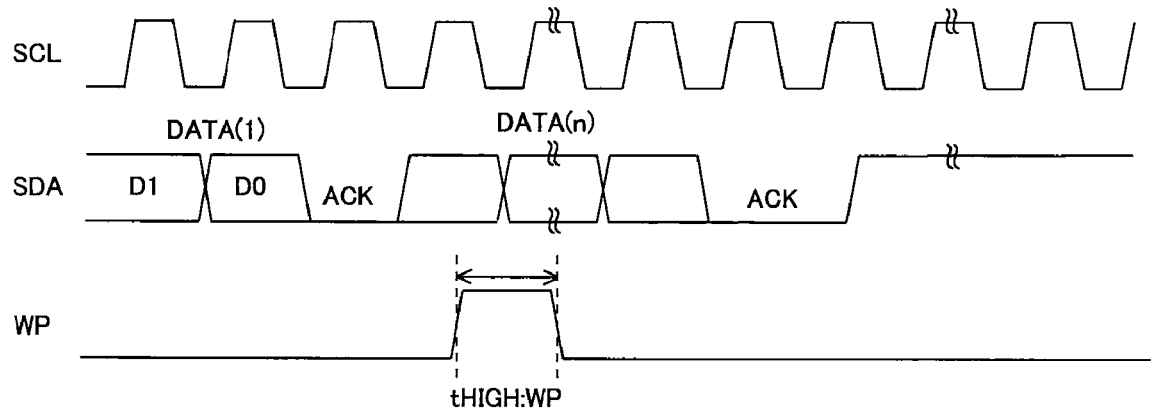

FIGS. 13A and 13B are timing charts showing the timing of write protection. In FIG. 13A is shown the timing of the input of the write-protect signal WP when a write operation is performed. In FIG. 13B is shown the timing of the input of the write-protect signal WP when the write operation is canceled.

In the semiconductor device 10, when the write-protect signal WP is turned high (Vcc), data is prevented from being rewritten at all addresses. In contrast, when the write-protect signal WP is turned low (GND), data is allowed to be rewritten at all addresses. Thus, it is necessary to avoid using the WP terminal (the seventh pin) as an open terminal, and it is required to apply either the power supply voltage Vcc or the ground voltage GND to the WP terminal or to turn it high or low.

If, as shown in FIG. 13A, the write-protect signal WP is turned low a WP setup period tSU:WP before the rising edge of the serial clock signal SCL when the final bit D0 among eight bits D0 to D7 constituting the first data DATA (1) is stored, the write operation of the data DATA (1) to DATA (n) is successfully performed without a write command being canceled.

If, as shown in FIG. 13A, after the input of the stop condition (stop bit), the internal write cycle period tWR elapses and then a WP hold period tHD:WP elapses, even when the write-protect signal WP is turned high, the write command is not cancelled. Thus, the write operation of the data DATA (1) to DATA (n) is performed successfully. However, if the write-protect signal WP is turned high within the internal write cycle period tWR, the write operation is forcefully terminated at that point. This makes it impossible to ensure that data is written into an address being accessed, with the result that it becomes necessary to rewrite it.

When, as shown in FIG. 13B, in a period from when the final bit D0 among the eight bits D0 to D7 constituting the first data DATA (1) is stored on the rising edge of the serial clock signal SCL to when the internal write cycle period tWR elapes, the write-protect signal WP is kept high only for a predetermined period (a WP effective period tHIGH:WP), the write command can be cancelled and the write operation of the data DATA (1) to DATA (n) can be cancelled.

It is preferable to appropriately set various periods (tWR, tSU:WP, tHD:WP and tHIGH:WP) shown in FIGS. 13A and 13B according to the specifications shown in FIG. 10.

Figure 14:
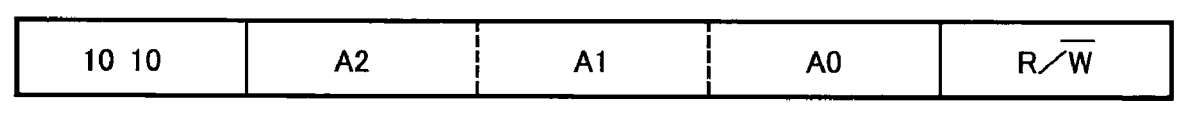

FIG. 14 is a data map showing the detail of the slave address.

An I$^2$C bus can have a plurality of slaves (up to eight slaves) connected thereto, and the use of the slave address allows any of the slaves to be placed into an active state. Thus, when the master accesses the semiconductor device 10, the slave address is inputted after the input of the start condition so that the addressing of the semiconductor device 10 is performed.

The four highest-order bits of the slave address is a device code that is used to recognize the type of device; the device code of the semiconductor device 10 (EEPROM) is set fixed at "1010".

The three bits following the device code is a device address (A2, A1 and A0) that is used for device selection; the semiconductor device 10 can use up to eight different device addresses on one bus.

The least significant bit (R/W) of the slave address is a bit that is used to designate which of the read operation and the write operation is performed. When the read operation is designated, the bit is set high (1); when the write operation is designated, the bit is set low (0). When a word address is set in a random read that will be described later (when a dummy write is performed), the bit is also set low (0).

Figure 15:
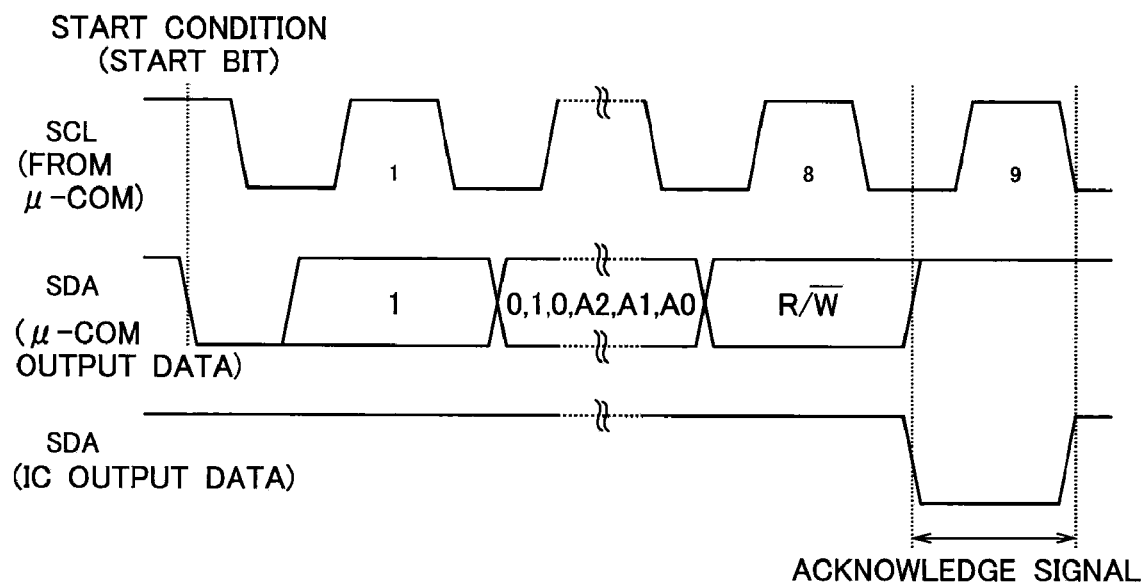
FIG. 15 is a timing chart showing the response behavior of an acknowledge signal.

FIG. 15 is a timing chart showing the response behavior of an acknowledge signal ACK; it shows its behavior when the semiconductor device 10 receives the slaves address from the master.

The acknowledge signal ACK is a signal that is exchanged between the master and the slave according to algorithms of software to indicate whether or not data transmission is performed successfully.

Whether the master or the slave, a device (when a slave address for either a write instruction or a read instruction is inputted, such a device is a microcomputer; when data for a read instruction is outputted, such a device is the semiconductor device 10) serving as a transmitter (transmission) is set to open the bus after outputting eight-bit data.

In the cycle period of the ninth clock of the serial clock signal SCL, a device (when a slave address for either a write instruction or a read instruction is inputted, such a device is the semiconductor device 10; when data for a read instruction is outputted, such a device is a microcomputer) serving as a receiver (reception) turns the serial data signal SDA low and outputs the acknowledge signal ACK to notify that the eight-bit data is received.

As shown in FIG. 15, the semiconductor device 10 turns the acknowledge signal ACK low after recognizing the start condition and the slave address (eight bits).

Figure 16:
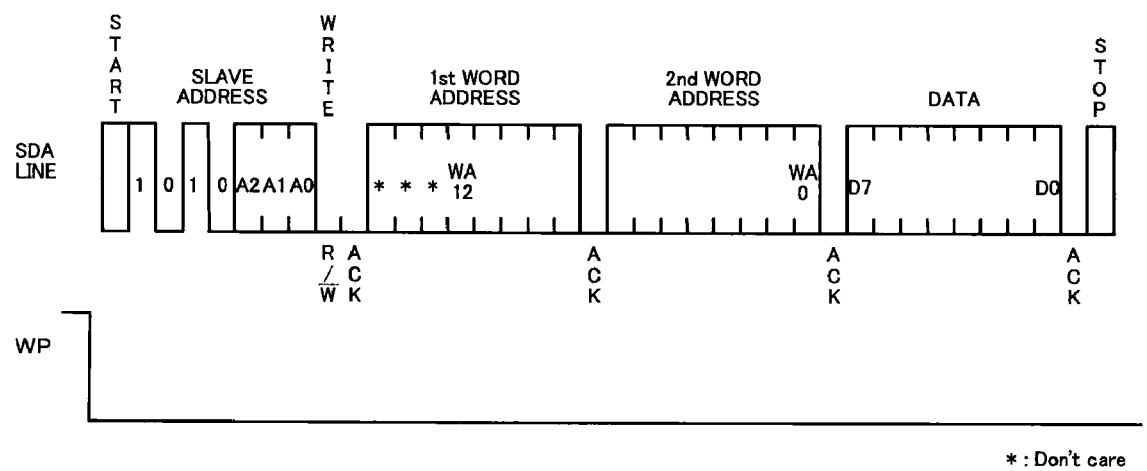
FIG. 16 is a timing chart showing a byte write cycle.
Figure 17:
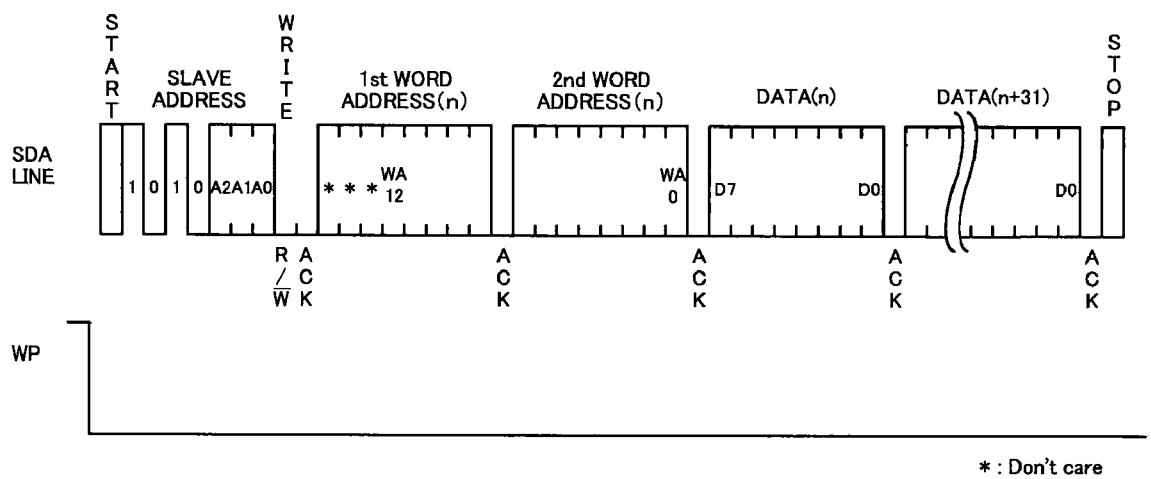
FIG. 17 is a timing chart showing a page write cycle.

As shown in FIGS. 16 and 17, which will be described later, in the write operation, the semiconductor device 10 turns the acknowledge signal ACK low every time it receives the eight-bit data (word address and write data).

Figure 18:
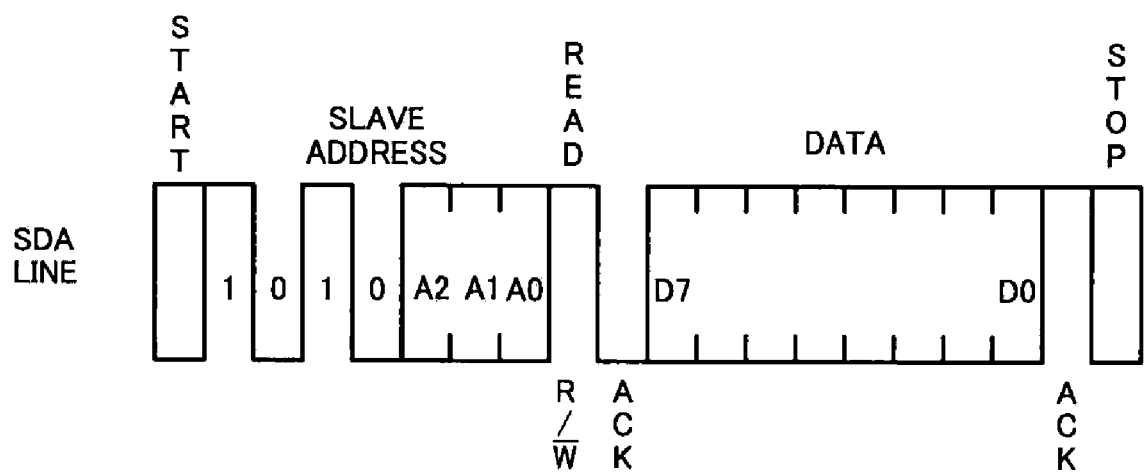
FIG. 18 is a timing chart showing a current read cycle.
Figure 19:
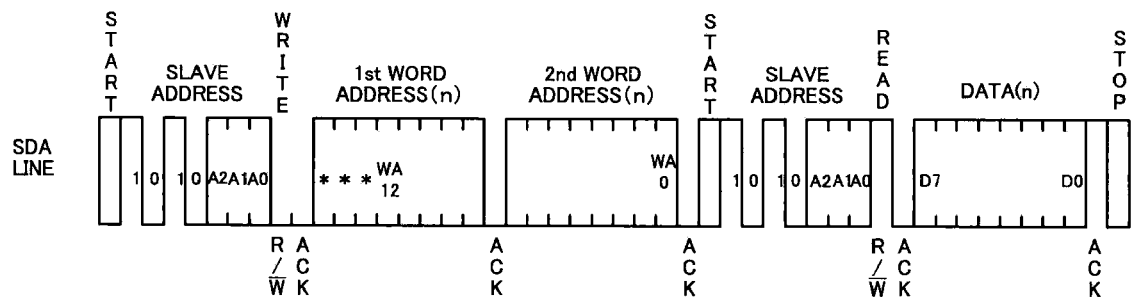
FIG. 19 is a timing chart showing a random read cycle.
Figure 20:
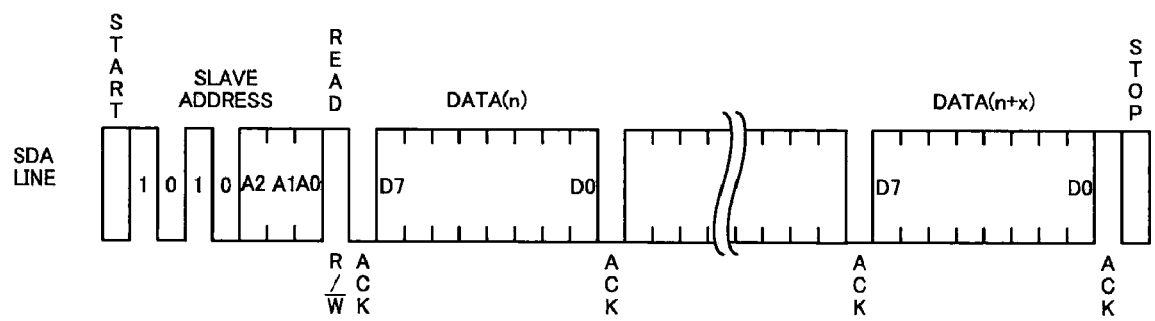
FIG. 20 is a timing chart showing a sequential read cycle.

As shown in FIGS. 18 to 20, which will be described later, in the read operation, the semiconductor device 10 outputs the eight-bit data (read data) and detects the low-level acknowledge signal ACK as a response from the master (microcomputer). When the low-level acknowledge signal ACK is detected and the stop condition is not fed from the master, the semiconductor device 10 continues to output the data. When the low-level acknowledge signal ACK is not detected, the semiconductor device 10 stops the data transfer and recognizes the stop condition (stop bit) to terminate the read operation. Then, the semiconductor device 10 enters a standby mode.

FIG. 16 is a timing chart showing a byte write cycle.

In the byte write cycle, data equivalent to one byte is only written into an address specified by the word address (the nth address). The word address WA0 to WA12 is separated into the first word address and the second word address, and they are then inputted. This is because whereas the word address WA0 to WA12 is 13 bits long, data is transferred on the I²C bus in groups of eight bits. Thus, the three highest-order bits of the first word address are set at "don't care" (*). After the input of the eight-bit data D0 to D7, the stop bit is fed to start the write operation into the EEPROM array 11.

FIG. 17 is a timing chart showing a page write cycle.

In the page write cycle, data of up to 32 bytes is written at a time. Specifically, in the page write cycle, when the word address WA0 to WA12, into which data is first written, is arbitrarily specified and then data of two bytes or greater is continuously inputted, the five lowest-order bits (WA4 to WA0) of the word address are automatically incremented inside the semiconductor device 10 (specifically the slave/word address register 13) and the data of up to 32 bytes is written into consecutive addresses one after another. It should be noted that when data of 32 bytes or greater is fed, it overwrites the previously stored data.

FIG. 18 is a timing chart showing a current read cycle.

In the current read cycle, without the need to specify a read address, data is read by reference to an address specified by an instruction executed immediately before the present instruction. Specifically, when the instruction executed immediately before the present instruction serves to perform a random read or a current read (each including a sequential read), data at the (n+1)th address obtained by incrementing by one the nth address, from which data is finally read, is read. When the instruction executed immediately before the present instruction serves to perform a byte write or a page write, data at the nth address, into which data is finally written, is read.

When the final bit D0 in the data DATA is read, and then a low-level acknowledge signal ACK is detected and the stop condition is not fed from the master (microcomputer), data at the next word address can then be read and all 64K bits (8192 words) can also be read. Such a sequential read cycle will be described later.

As shown in FIG. 18, the final bit D0 in the data DATA is read, and then the acknowledge signal ACK is turned high and the stop condition (stop bit) is inputted. By doing so, it is possible to terminate the current read cycle.

When the final bit D0 in the data DATA is read and then the acknowledge signal ACK is turned not high but low, the above-described sequential read is performed. Thus, the data at the next word address is outputted, so that the current read cycle is not terminated. Hence, in order to terminate the current read cycle, it is necessary to turn the acknowledge signal ACK high after the final bit D0 in the data DATA is read and then input the stop condition (stop bit).

FIG. 19 is a timing chart showing a random read cycle.

In the random read cycle, the word address (the nth address), from which data should be read, is arbitrarily specified through the use of a dummy write cycle (in which data is not written), with the result that data at the present address is read.

When the final bit D0 in the data DATA (n) is read, and then the low-level acknowledge signal ACK is detected and the stop condition is not fed from the master (microcomputer), like the current read cycle described above, data at the next word address (n+1) can then be read and all 64K bits (8192 words) can also be read.

As shown in FIG. 19, the final bit D0 in the data DATA (n) is read, and then the acknowledge signal ACK is turned high and the stop condition (stop bit) is inputted. By doing so, it is possible to terminate the random read cycle.

When the final bit D0 in the data DATA (n) is read and then the acknowledge signal ACK is turned not high but low, the above-described sequential read is performed. Thus, the data at the next word address (n+1) is outputted, so that the random read cycle is not terminated. Hence, in order to terminate the random read cycle, it is necessary to turn the acknowledge signal ACK high after the final bit D0 in the data DATA (n) is read and then input the stop condition (stop bit).

FIG. 20 is a timing chart showing the sequential read cycle.

As described in the description of the current read cycle and the random read cycle, when the final bit D0 in the data DATA (n) is read, and then the low-level acknowledge signal ACK is detected and the stop condition is not fed from the master (microcomputer), data at the next word address (n+1) can then be read and all 64K bits (8192 words) can also be read.

In order to terminate the sequential read cycle, it is necessary to turn the acknowledge signal ACK high after the final bit D0 in data DATA (n+x) at any given address is read and then input the stop condition (stop bit).

Although FIG. 20 deals with a case where an initial address is not specified (when the current read is performed), the sequential read can be performed even when an initial address is specified (when the random read is performed).

The internal configuration and operation of the high-voltage generating circuit 16 will now be described in detail.

Figure 21:
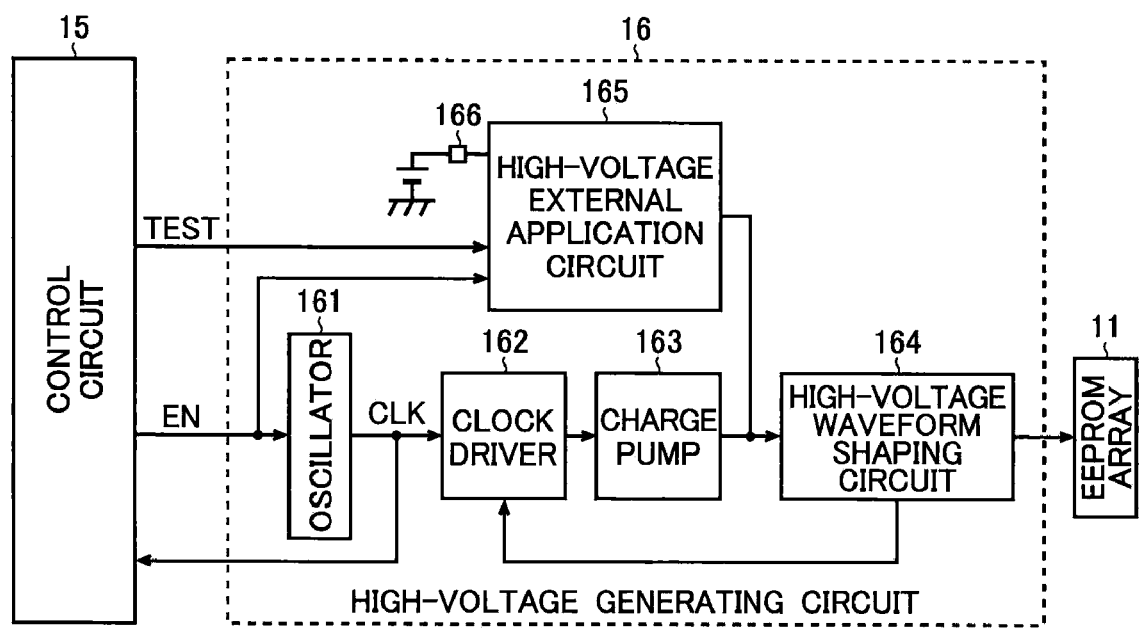
FIG. 21 is a block diagram showing an example of the configuration of a high voltage generating circuit 16.

FIG. 21 is a block diagram showing an example of the internal configuration of the high voltage generating circuit 16.

As shown in FIG. 21, the high-voltage generating circuit 16 has an oscillator 161, a clock driver 162, a charge pump 163, a high-voltage waveform shaping circuit 164, a high-voltage external application circuit 165 and a pad 166.

The oscillator 161 generates a clock signal CLK for use in driving the charge pump 163 or for use in counting a write period in the control circuit 15. The operation of the oscillator 161 is controlled by an enable signal EN fed from the control circuit 15. The internal configuration and operation of the oscillator 161 will be described later.

The clock driver 162 buffers the clock signal CLK generated in the oscillator 161 to improve current drive capability. An inverter, a buffer and the like can be used as the clock driver 162. The clock driver 162 has the function of interrupting, according to an output monitor signal fed from the high-voltage waveform shaping circuit 164, the supply of the clock signal CLK to the charge pump 163 so that the output voltage of the charge pump 163 does not exceed a predetermined upper limit. This function will be described in detail later.

The charge pump 163 has a plurality of charge-storage capacitors and a plurality of charge-transfer switches that are turned on and off according to the clock signal CLK. By repeating the storage and transfer of charge, the charge pump 163 generates a desired stepped-up voltage from the power supply voltage Vcc. The charge pump 163 of well-known conventional configuration can be employed, and thus its detailed description is omitted.

The high-voltage waveform shaping circuit 164 subjects the output voltage of the charge pump 163 to a waveform shaping treatment (a rising-speed reduction treatment and an upper limit clamping treatment), and supplies the resulting voltage to the EEPROM array 11. The internal configuration and operation of the high-voltage waveform shaping circuit 164 will be described later.

The high-voltage external application circuit 165 complements, when a screening test is performed under high temperature, the current drive capability of the charge pump 163 by superimposing an external voltage (for example, of 20 volts) applied to the pad 166 onto the output voltage of the charge pump 163. The operation of the high-voltage external application circuit 165 is controlled by the enable signal EN and a test mode signal TEST fed from the control circuit 15. The internal configuration and operation of the high-voltage external application circuit 165 will be described later.

The pad 166 is an external terminal through which voltage from the outside is received when the screening test is performed under high temperature. The pad 166 is an internal pad that does not appear on the outside of the semiconductor device 10 after the semiconductor device 10 is packaged; it is used only when the screening test on a wafer level (in a stage where the semiconductor device 10 is unpackaged) is performed. With this configuration, the completed device incorporating the semiconductor device 10 can avoid increasing the number of unnecessary pins.

The internal configuration and operation of the high-voltage external application circuit 165 will now be described in detail.

Figure 22:
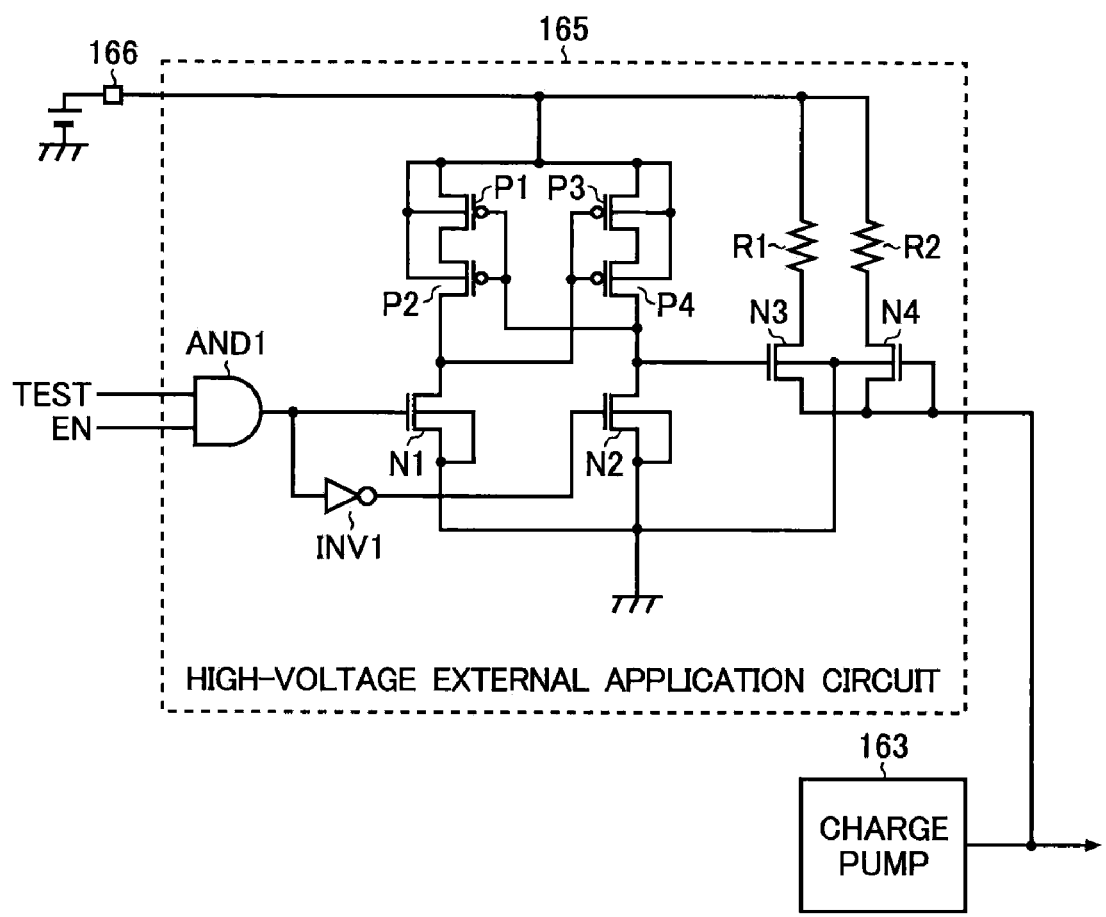
FIG. 22 is a circuit diagram showing an example of the configuration of a high-voltage external application circuit 165.

FIG. 22 is a circuit diagram showing an example of the configuration of the high-voltage external application circuit 165.

As shown in FIG. 22, the high-voltage external application circuit 165 of this configuration has P-channel MOS field-effect transistors P1 to P4, N-channel MOS field-effect transistors N1 to N4, resistors R1 and R2, an AND logic unit AND1 and an inverter INV1.

The sources of the transistors P1 and P3 are connected to the pad 166. The drains of the transistors P1 and P3 are connected to the sources of the transistors P2 and P4, respectively. The drains of the transistors P2 and P4 are connected to the drains of transistors N1 and N2, respectively. The gates of the transistors P1 and P2 are connected to the drain of the transistor N2. The gates of the transistors P3 and P4 are connected to the drain of the transistor N1. The back gates of the transistors P1 to P4 are connected to the pad 166. The sources and the back gates of the transistors N1 and N2 are grounded. In the high-voltage external application circuit 165 of this configuration, a level shifter that generates a gate signal for the transistor N3 is formed by the above-mentioned components (the transistors P1 to P4 and the transistors N1 and N2).

The drain of the transistor N3 is connected to the pad 166 via the resistor R1. The drain of the transistor N4 is connected to the pad 166 via the resistor R2. The sources of the transistors N3 and N4 are connected to the output terminal of the charge pump 163. The gate of the transistor N3 is connected to the drain of the transistor N2. The gate of the transistor N4 is connected to the source of the transistor N4. The back gates of the transistors N3 and N4 are grounded.

One input terminal of the AND logic unit AND1 is connected to a terminal through which a test signal TEST is applied. The other input terminal of the AND logic unit AND1 is connected to a terminal through which the enable signal EN is applied. The output terminal of the AND logic unit AND1 is connected to the gate of the transistor N1 and the input terminal of the inverter INV1. The output terminal of the inverter INV1 is connected to the gate of the transistor N2.

Before a description is given of the operation of the high-voltage external application circuit 165 configured as described above, problems involved in increasing the capacity of and reducing the size of the semiconductor device 10 will be described.

In order to reduce the rate of occurrence of early failure, it is necessary to perform an outgoing test for the semiconductor device 10 by applying a high voltage to a memory cell at a high temperature as compared with a normal outgoing test.

Figure 23:
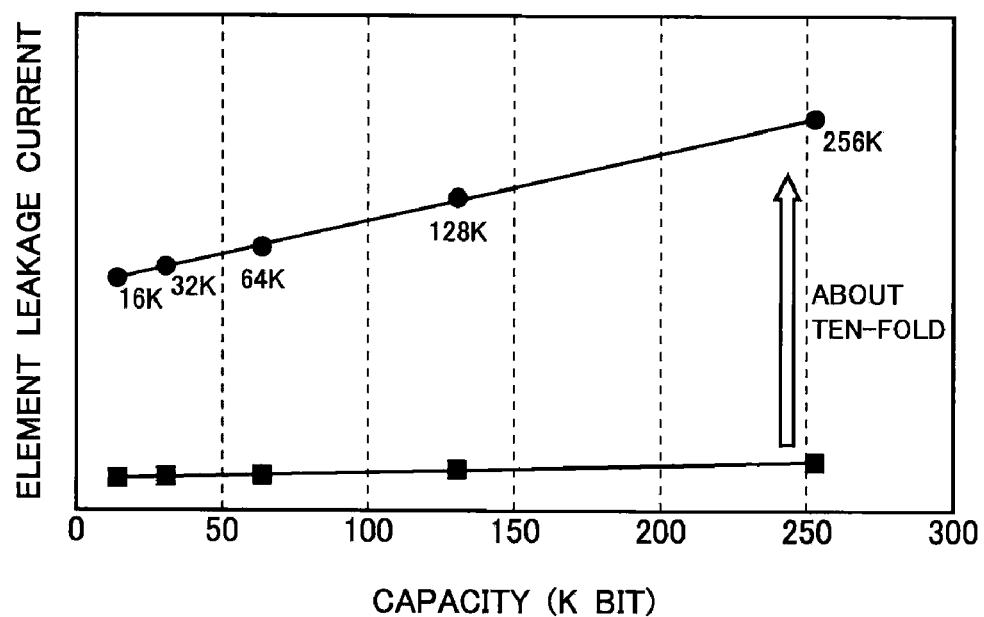
FIG. 23 is a diagram showing a correlation between the capacity of a memory cell and the leakage current of an element.

As the capacity of a memory cell is increased (the number of elements is increased), the leak current and the load capacity of an element tends to increase. In particular, when the test is performed under high temperature, as shown in FIG. 23, the leak current of the element is increased about tenfold as compared with that under normal temperature. Thus, in order to perform the test under high temperature, a voltage source having high current drive capability is essential.

If, however, the charge pump 163 is simply increased in size in order to enhance the current drive capability of the high-voltage generating circuit 16 incorporated in the semiconductor device 10, the area of a chip is increased (for example, it is increased by an area of 210 μm by 210 μm). This reduces the cost competitiveness.

To overcome such problems, the semiconductor device 10 of this embodiment incorporates the high-voltage external application circuit 165 described above and complements the current drive capability of the charge pump 163 with the high-voltage external application circuit 165 when the test is performed under high temperature. With this configuration, it is possible to perform the test under high temperature without unduly increasing the size of the charge pump 163.

The operation of the high-voltage external application circuit 165 incorporated to achieve the above-described purpose will be specifically described with reference to FIG. 22.

When the test is performed under high temperature, the test mode signal TEST is set high. Thus, the enable signal EN is fed to the gates of the transistors N1 and N2 directly and via the inverter INV without being interrupted by the AND logic unit AND1.

Here, when the enable signal EN is high, the gate voltage of the transistor N1 is turned high and thus the transistor N1 is turned on, and the gate voltage of the transistor N2 is turned low and thus the transistor N2 is turned off. Accordingly, the gate voltage of the transistors P3 and P4 is turned low and thus the transistors P3 and P4 are turned on, and the gate voltage of the transistors P1 and P2 is turned high and thus the transistors P1 and P2 are turned off. Consequently, the gate voltage of the transistor N3 is turned high and thus the transistor N3 is turned on, and the external voltage applied to the pad 166 is superimposed on the output voltage of the charge pump 163 via the transistor N3.

In contrast, when the enable signal EN is low, the gate voltage of the transistor N1 is turned low and thus the transistor N1 is turned off, and the gate voltage of the transistor N2 is turned high and thus the transistor N2 is turned on. Accordingly, the gate voltage of the transistors P1 and P2 is turned low and thus the transistors P1 and P2 are turned on, and the gate voltage of the transistors P3 and P4 is turned high and thus the transistors P3 and P4 are turned off. Consequently, the gate voltage of the transistor N3 is turned low and thus the transistor N3 is turned off, and the external voltage applied to the pad 166 is interrupted by the transistor N3 without being superimposed on the output voltage of the charge pump 163.

When the semiconductor device 10 operates normally (that is, when the high-voltage external application circuit 165 is not used), the test mode signal TEST is set low. Thus, the logic output of the AND logic unit AND1 is always kept low irrespective of the enable signal EN. Hence, the gate voltage of the transistor N3 is always kept low, with the result that the high-voltage external application circuit 165 is kept in an undriven state.

If, however, the voltage level of the pad 166 varies, even when the test mode signal TEST is set low, the high-voltage external application circuit 165 may malfunction unintentionally. This may prevent the normal operation of the semiconductor device 10.

In the high-voltage external application circuit 165 of this configuration, the diode-connected transistor N4 is provided in parallel with the transistor N3. With this configuration, when the semiconductor device 10 operates normally, the transistor N4 is kept forward-biased, and thus a drive voltage is supplied to the high-voltage external application circuit 165. This eliminates the possibility that the high-voltage external application circuit 165 malfunctions. By setting the test mode signal TEST low, it is possible to reliably place the high-voltage external application circuit 165 in an undriven state.

In the high-voltage external application circuit 165 of this configuration, the transistors P1 and P2 are paired and so are the transistors P3 and P4; this is to apparently increase the size of such elements and thus increase the withstand voltage of the elements.

The internal configuration and operation of the oscillator 161 will now be described in detail.

Figure 24:
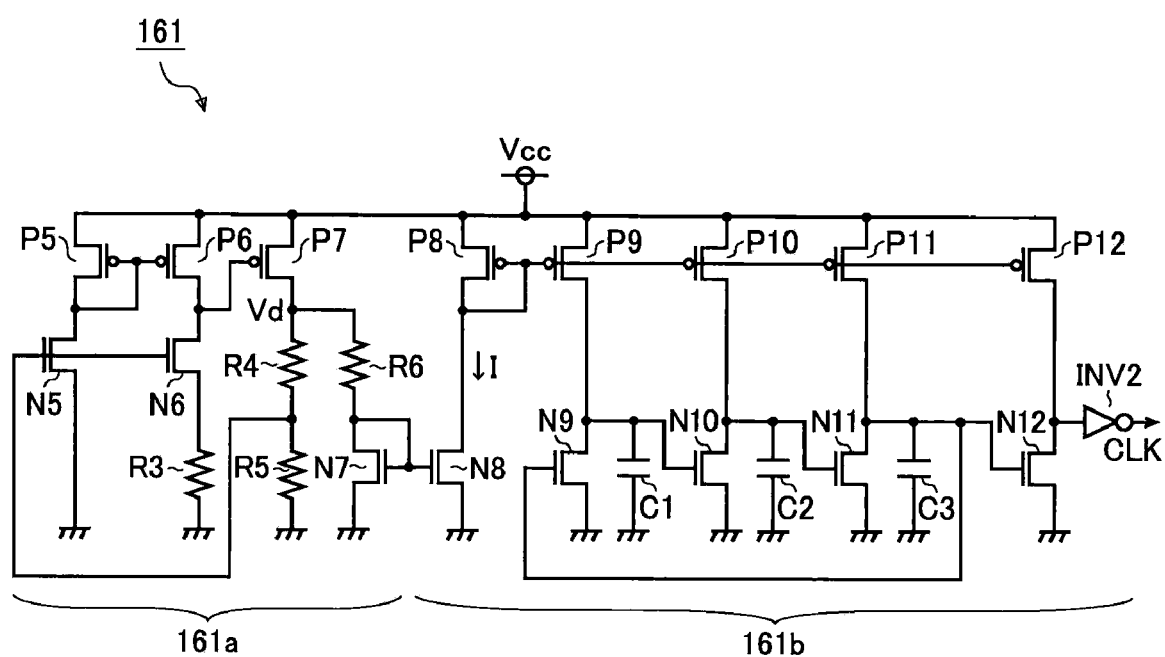
FIG. 24 is a circuit diagram showing an example of the configuration of an oscillator 161.

FIG. 24 is a circuit diagram showing an example of the configuration of the oscillator 161.

As shown in FIG. 24, the oscillator 161 of this configuration has P-channel MOS field-effect transistors P5 to P12, N-channel MOS field-effect transistors N5 to N12, resistors R3 to R6, capacitors C1 to C3 and an inverter INV2.

The sources of the transistors P5 and P6 are connected to the terminal of the power supply. The gates of the transistors P5 and P6 are connected to the drain of the transistor P5. The drains of the transistors P5 and P6 are connected to the drains of transistors N5 and N6, respectively. The source of the transistor N5 is grounded. The source of the transistor N6 is grounded via the resistor R3. The source of the transistor P7 is connected to the terminal of the power supply. The gate of the transistor P7 is connected to the drain of the transistor P6. The drain of the transistor P7 is grounded via the resistors R4 and R5 and is also connected to the drain of the transistor N7 via the resistor R6. The node between the resistors R4 and R5 is connected to the gates of the transistors N5 and N6. The gate of the transistor N7 is connected to the gate of the transistor N8 and is also connected to the drain of the transistor N7. The source of the transistor N7 is grounded. In the oscillator 161 of this configuration, a constant current circuit 161a is formed by the above-mentioned components (the transistors P5 to P7, the transistors N5 to N7 and the resistors R3 to R6).

The sources of the transistors P8 to P12 are connected to the terminal of the power supply. The gates of the transistors P8 to P12 are connected to the drain of the transistor P8. The drains of the transistors P8 to P12 are connected to the drains of the transistors N8 to N12, respectively. The sources of the transistors N8 to N12 are grounded. The drain of the transistor N9 is grounded via the capacitor C1 and is also connected to the gate of the transistor N10. The drain of the transistor N10 is grounded via the capacitor C2 and is also connected to the gate of the transistor N11. The drain of the transistor N11 is grounded via the capacitor C3 and is also connected to the gates of the transistors N9 and N12. The drain of the transistor N12 is connected via the inverter INV 2 to a terminal through which clocks are outputted. In the oscillator 161 of this configuration, an oscillation circuit 161b is formed by the above-mentioned components (the transistors P8 to P12, the transistors N8 to N12, the capacitors C1 to C3 and the inverter INV2).

The constant current circuit 161a configured as described above generates a constant current I according to an on threshold voltage Vth of the transistor N6, and passes it to the oscillation circuit 161b.

In the constant current circuit 161a, as the drain voltage Vd of the transistor P7 increases, a feedback voltage (a voltage obtained by dividing the drain voltage Vd) derived from the node between the resistors R4 and R5 increases. Hence, the conductivity of the transistors N5 and N6 increases, and thus a current through the resistor R3 increases. Consequently, the gate voltage of the transistor P7 increases, and thus the conductivity of the transistor P7 decreases, with the result that the drain voltage Vd decreases.

In contrast, as the drain voltage Vd of the transistor P7 decreases, the feedback voltage derived from the node between the resistors R4 and R5 decreases. Hence, the conductivity of the transistors N5 and N6 decreases, and thus the current through the resistor R3 decreases. Consequently, the gate voltage of the transistor P7 decreases, and thus the conductivity of the transistor P7 increases, with the result that the drain voltage Vd increases.

As described above, the drain voltage Vd of the transistor P7 is not dependent on the power supply voltage Vcc and is kept at a predetermined value determined by the on threshold voltage Vth of the transistor N6 and the resistance of the resistor R3.

The drain voltage Vd of the transistor P7 maintained at the predetermined value by the feedback control is converted by the resistor R6 such that the resulting current is passed through a current mirror circuit composed of the transistors N7 and N8 and is outputted as the constant current I.

Figure 25A:
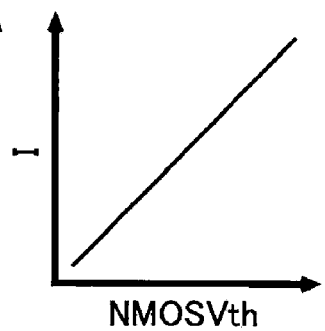
FIGS. 25A to 25D are diagrams for describing a flat characteristic of an oscillating frequency fosc.

The higher the on threshold voltage Vth of the transistor N6, the higher the target value of the drain voltage Vd of the transistor P7, and hence the higher the constant current I. Specifically, the constant current I varies positively with the on threshold voltage Vth of the transistor N6 as shown in FIG. 25A.

The oscillation circuit 161b configured as described above is a ring oscillator in which an odd number of stages (in this configuration, three stages) of grounded-source amplifiers formed by the transistors N9 to N11 are connected in a loop.

In the oscillation circuit 161b, the constant current I (more precisely, the mirror current of the constant current circuit 161a) supplied from the constant current circuit 161a is used for charging the capacitors C1 to C3. Thus, the higher the constant current I, the faster the turning on of the transistors N9 to N11, and hence the higher the oscillating frequency fosc of the clock signal CLK. Specifically, the oscillating frequency fosc of the clock signal CLK varies positively with the constant current I as shown in FIG. 25B.

In contrast, the higher the on threshold voltage Vth of the transistors N9 to N11, the slower the turning on of the transistors N9 to N11, and hence the lower the oscillating frequency fosc of the clock signal CLK. Specifically, the oscillating frequency fosc of the clock signal CLK varies negatively with the on threshold voltage Vth of the transistors N9 to N11 as shown in FIG. 25C.

Figure 25B:
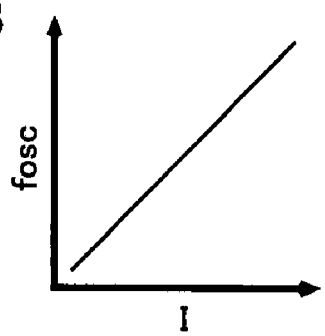
Figure 25C:
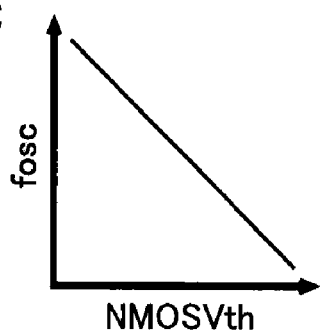
Figure 25D:
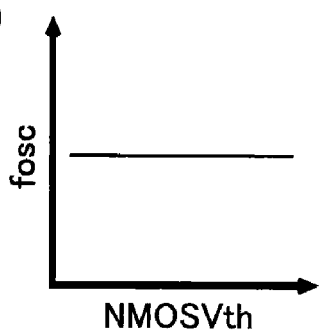

Hence, in the oscillator 161 of this configuration, even when the on threshold voltage Vth of the N-channel MOS field-effect transistors (in the example of FIG. 24, the transistors N5 to N12) varies in the manufacturing process of the semiconductor device 10, since the positive variation of the oscillating frequency fosc shown in FIGS. 25A and 25B and the negative variation of the oscillating frequency fosc shown in FIG. 25C cancel each other out, the resulting oscillating frequency fosc of the clock signal CLK always has a flat characteristic as shown in FIG. 25D irrespective of the on threshold voltage Vth of the N-channel MOS field-effect transistors.

Thus, with the oscillator 161 of this configuration, it is possible to generate the clock signal CLK of stable oscillating frequency fosc irrespective of variations in the power supply voltage Vcc and the on threshold voltage Vth of the N-channel MOS field-effect transistors.

In particular, the clock signal CLK generated in the oscillator 161 is used as a clock for counting a write period in the control circuit 15. Although the write period of the EEPROM array 11 depends on the oscillating frequency fosc of the clock signal CLK, the use of the oscillator 161 of this configuration results in improved write characteristics over a wide range of power supply voltages.

Figure 26:
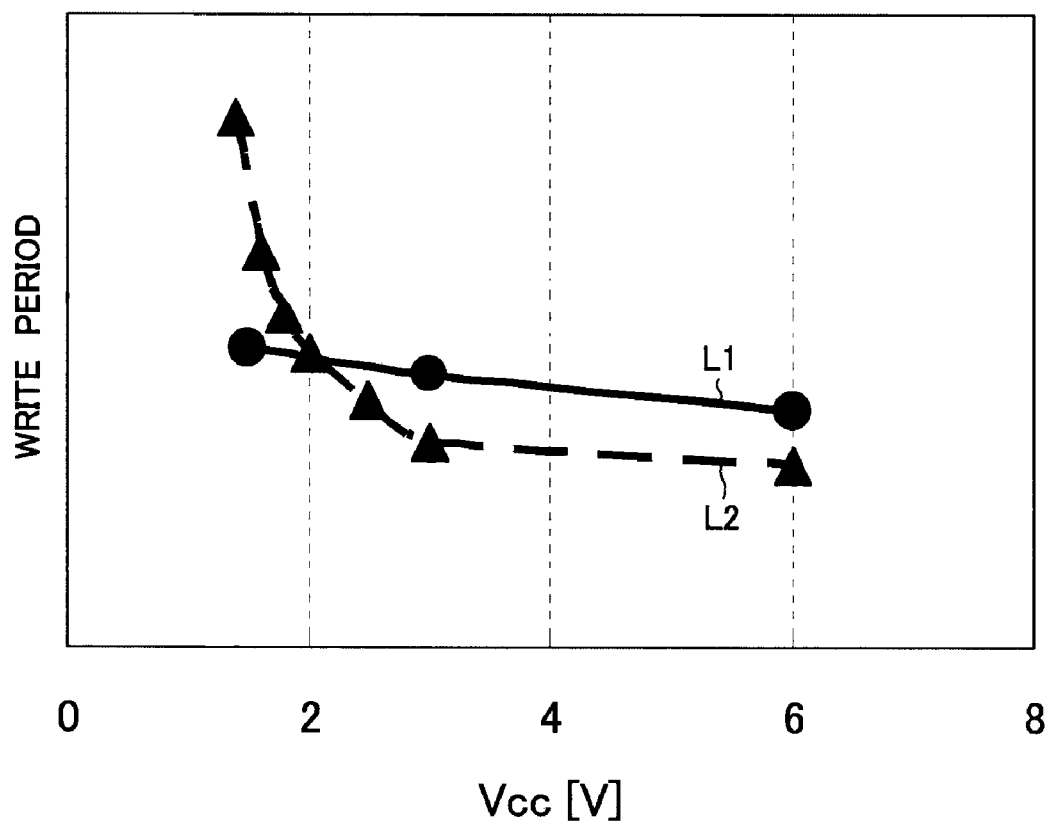
FIG. 26 is a diagram showing a correlation between a power supply voltage and a write period.

FIG. 26 is a diagram showing a correlation between the power supply voltage and the write period. A solid line L1 in the figure shows the behavior according to the present invention; a broken line L2 shows the behavior according to the conventional configuration (a common ring oscillator composed of an odd number of stages of inverters).

As shown in FIG. 26, with the oscillator 161 of this configuration, it is possible to reduce the write period over a wide range of power supply voltages (at least from 1.7 to 5.5 volts).

In the oscillator 161 of this configuration, the constant current circuit 161a generates the constant drain voltage Vd determined by the on threshold voltage Vth of the transistor N6 and the resistance of the resistor R3, and the drain voltage Vd is converted by the resistor R5 to generate a predetermined constant current I. Thus, it is possible to achieve normal operation without any problem with a low power supply voltage Vcc of about 1.7 volts.

In the oscillator 161 of this configuration, the oscillation circuit 161b is a ring oscillator incorporating the grounded-source amplifiers, and the number of stages of series-connected transistors is reduced as compared with the conventional configuration (a common ring oscillator composed of an odd number of stages of inverters). Thus, with this configuration, it is possible to achieve normal operation without any problem even with a low power supply voltage Vcc of about 1.7 volts.

Thus, with the oscillator 161 of this configuration, it is possible to provide a low voltage drive (a 1.7 volt drive) that is required in fields such as mobile telephones and camera modules.

The internal configuration and operation of the high-voltage waveform shaping circuit 164 will now be described in detail.

Figure 27:
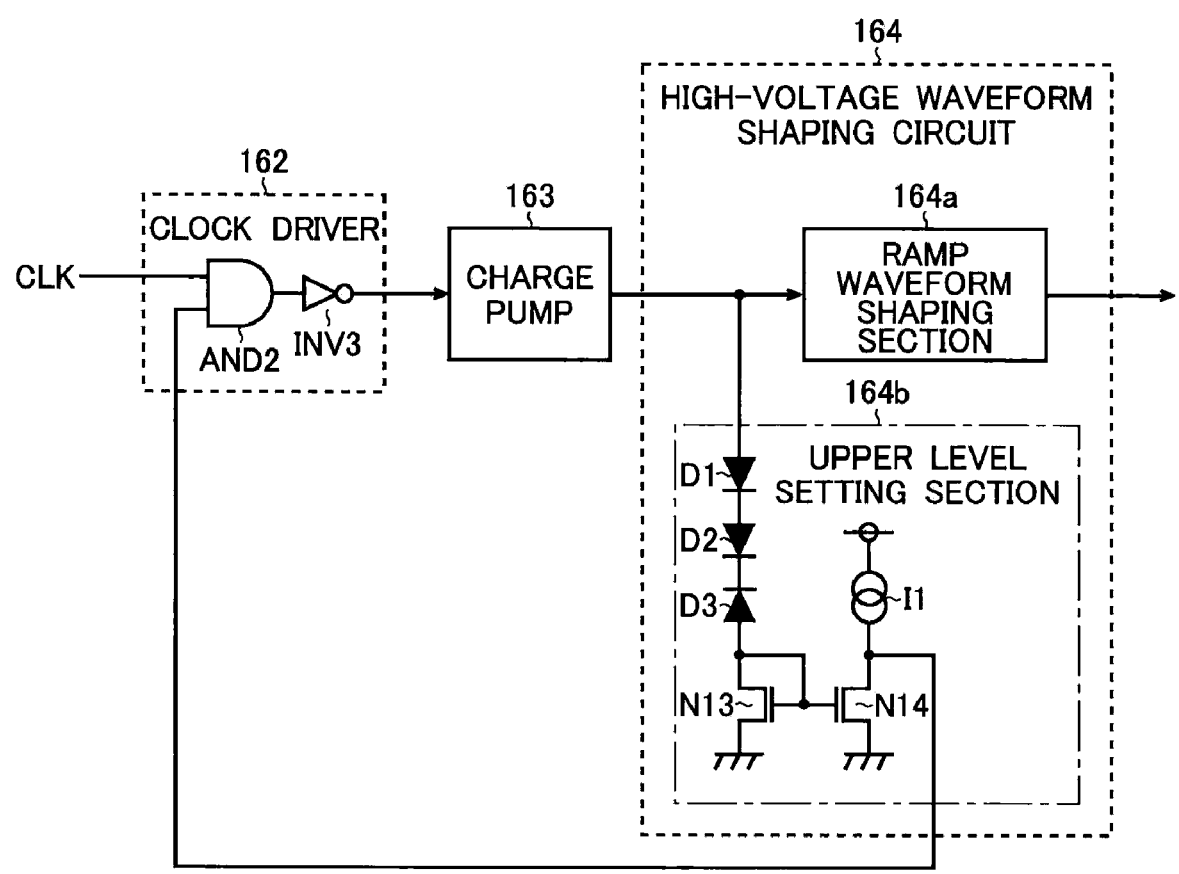
FIG. 27 is a circuit block diagram showing an example of the configuration of a high-voltage waveform shaping circuit 164.

FIG. 27 is a circuit block diagram showing an example of the configuration of the high-voltage waveform shaping circuit 164.

As shown in FIG. 27, the high-voltage waveform shaping circuit 164 of this configuration has a ramp waveform shaping section 164a and an upper limit level setting section 164b.

The ramp waveform shaping section 164a reduces the speed at which the output voltage of the charge pump 163 rises. By performing such waveform shaping, it is possible to reduce stress on the EEPROM array 11 to extend the life of the memory cell.

The upper limit level setting section 164b sets the output voltage of the charge pump 163 at a predetermined upper limit level; it has N-channel MOS field-effect transistors N13 and N14, diodes D1 to D3 and a constant current source I1.

The anode of the diode D1 is connected to the output terminal of the charge pump 163. The cathode of the diode D1 is connected to the anode of the diode D2. The cathode of the diode D2 is connected to the cathode of the diode D3. The anode of the diode D3 is connected to the drain of the transistor N13. The sources of the transistors N13 and N14 are grounded. The gates of the transistors N13 and N14 are connected to the drain of the transistor N13. The drain of the transistor N14 serves as a terminal thorough which the output monitor signal is outputted; it is connected to the terminal of the power supply through the constant current source I1.

A clock driver 162 that receives the output monitor signal from the upper limit level setting section 164b has an AND logic unit AND2 and an inverter INV2 (or it may be a buffer).

One input terminal of the AND logic unit AND2 is connected to a terminal through which the clock signal CLK is fed. The other input terminal of the AND logic unit AND2 is connected to the drain of the transistor N14.

In the upper limit level setting section 164b configured as described above, when the output voltage of the charge pump 163 reaches the predetermined upper limit level, the diode D3 breaks down and thus a high current is passed through the transistors N13 and N14. Hence, the potential of the output monitor signal derived from the drain of the transistor N14 decreases to a low level. Accordingly, since the logic output of the AND logic unit AND2 included in the clock driver 162 is always kept low irrespective of the clock signal CLK, the charge pump 163 is placed in an undriven state and its output voltage decreases. With this operation, the output voltage of the charge pump 163 is clamped so as not to exceed the predetermined upper limit level.

The upper limit level setting section 164b configured as described above roughly sets an upper limit level by use of the breakdown voltage of the diode D3 in a reverse-biased state; it fine-tunes the upper limit level by use of the forward drop voltages of the diodes D2 and D3 in a forward-biased state.

With this configuration, it is possible to reduce the number of stages of series-connected diodes as compared with a case where the upper limit level of an output voltage is set by use of only the forward drop voltage of a diode. Thus, it is possible to reduce the area of a chip and minimize variations in forward drop voltage.

Needless to say, instead of the diodes D1 to D3, diode-connected transistors may be used.

Although the above embodiment deals with a case where the present invention is applied to an EEPROM, the invention is not limited to this application. The invention finds wide application in other semiconductor devices.

Many modifications and variations are possible without departing from the spirit of the present invention.

The benefits of an oscillator according to the present invention will now be discussed. With an oscillator of the invention, it is possible to provide a stable oscillating frequency and a low voltage drive.

The industrial applicability of an oscillator according to the invention will now be discussed. The technology of the invention is useful in increasing the capacity of and reducing the size of an EEPROM.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention which fall within the true spirit and scope of the invention.

What is claimed is:

1. An oscillator comprising:
   a current generating circuit in which a current generated in the current generating circuit varies positively with an on threshold voltage of a transistor included in the current generating circuit, the current generating circuit including a negative feedback portion to provide negative feedback to said transistor; and
   an oscillating circuit in which an oscillating frequency of a clock signal generated in the oscillating circuit varies positively with the current supplied from the current generating circuit, and the oscillating frequency of the clock signal generated in the oscillating circuit varies negatively with an on threshold voltage of a transistor included in the oscillating circuit.

2. The oscillator of claim 1, wherein the current generating circuit generates a constant voltage determined by the on threshold voltage of the transistor in the current generating circuit and converts the constant voltage to generate the current.

3. The oscillator of claim 1, wherein the oscillating circuit is a ring oscillator in which a grounded-source amplifier formed by the transistor in the oscillating circuit is connected in a loop and uses the current supplied from the current generating circuit to charge a capacitor connected to a gate of the transistor in the oscillating circuit.

* * * * *